(12) United States Patent
Koyasu

(10) Patent No.: US 7,248,634 B2
(45) Date of Patent: Jul. 24, 2007

(54) INTEGRATED CIRCUIT FOR TRANSCEIVER DEVICE WITH MEANS FOR SUPPRESSING SUPERIMPOSED NOISE AND FOR GENERATING A MORE ACCURATE OUTPUT SIGNAL

(75) Inventor: Takahisa Koyasu, Chita (JP)

(73) Assignee: Denso Corporation, Kariya (JP)

( * ) Notice: Subject to any disclaimer, the term of this patent is extended or adjusted under 35 U.S.C. 154(b) by 748 days.

(21) Appl. No.: 10/696,022

(22) Filed: Oct. 30, 2003

(65) Prior Publication Data

US 2004/0141560 A1   Jul. 22, 2004

(30) Foreign Application Priority Data

Jan. 22, 2003 (JP) ............................ 2003-013491
Mar. 24, 2003 (JP) ............................ 2003-080312

(51) Int. Cl.
 *H04L 27/00* (2006.01)
(52) U.S. Cl. ..................... 375/256; 375/219; 327/130; 331/111; 708/852
(58) Field of Classification Search ............... 375/256, 375/257, 258, 219; 708/852; 331/111; 327/130; 361/64
See application file for complete search history.

(56) References Cited

U.S. PATENT DOCUMENTS

| 4,471,399 | A | * | 9/1984 | Udren | ...................... | 361/64 |
|---|---|---|---|---|---|---|
| 4,645,946 | A | * | 2/1987 | Ishikawa et al. | ............ | 327/130 |
| 4,896,333 | A | * | 1/1990 | Can | ........................... | 375/219 |
| 4,988,958 | A | * | 1/1991 | Tsuruoka et al. | ........... | 331/111 |
| 5,638,402 | A | * | 6/1997 | Osaka et al. | ................ | 375/257 |
| 6,269,388 | B1 | * | 7/2001 | Pioppo | ....................... | 708/852 |
| 6,518,803 | B2 | | 2/2003 | Nagata et al. | | |

FOREIGN PATENT DOCUMENTS

JP    A-H09-261016    10/1997

* cited by examiner

*Primary Examiner*—Phuong Phu
(74) *Attorney, Agent, or Firm*—Posz Law Group, PLC

(57) ABSTRACT

A serial communication transceiver includes a trapezoidal wave signal generation circuit for producing a trapezoidal wave signal responsive to a control signal. The trapezoidal wave signal generation circuit decreases harmonic components in the trapezoidal wave signal and suppresses superimposed noise. The serial communication transceiver also includes a driver circuit for delivering the trapezoidal wave signal to a communication line and a receiver circuit for receiving the trapezoidal wave signal over the communication line. The receiver circuit includes a filter circuit that has a filtering time at the rise of a logically bi-leveled signal substantially equal to a filtering time at the fall of the logically bi-leveled signal.

20 Claims, 11 Drawing Sheets

INTEGRATED CIRCUIT FOR TRANSCEIVER DEVICE WITH MEANS FOR SUPPPRESSING SUPERIMPOSED NOISE AND FOR GENERATING A MORE ACCURATE OUTPUT SIGNAL

CROSS REFERENCE TO RELATED APPLICATIONS

This application is based upon, claims the benefit of priority of, and incorporates by reference the contents of Japanese Patent Application No. 2003-13491 filed on Jan. 22, 2003 and Japanese Patent Application No. 2003-80312 filed on Mar. 24, 2003.

FIELD OF THE INVENTION

The present invention relates generally to transceiver devices and, more particularly, to transceiver devices with communication protocols, such as, for example, an asynchronous serial communication receiver.

BACKGROUND OF THE INVENTION

Transceivers used, for example, for asynchronous serial communication, include circuitry for generating trapezoidal wave signals and for filtering noise in an output signal.

JP-A-2002-152015 discloses a charge-and-discharge circuit which includes two constant current circuits and a capacitor, with one constant current circuit connected in series to the capacitor being adapted to charge the capacitor and another constant current circuit connected in parallel to the capacitor being adapted to discharge the capacitor (Shown in FIG. 1 of this publication). This charge-and-discharge circuit is intended to produce a trapezoidal wave voltage, while by connecting a switch circuit between the capacitor and the discharging constant current circuit and turning on and off the switch circuit in response to an input signal having two logical levels, the circuit can be used as a noise filtering circuit for the input signal.

JP-A-9-261016 discloses a trapezoidal wave signal generator for producing a trapezoidal wave signal with suppressed harmonic components by utilization of the characteristics of MOS transistors.

FIG. 13 illustrates an exemplary circuit arrangement 1 for producing a trapezoidal wave voltage and for eliminating the noise included in the reception signal received during, for example, asynchronous serial communication. This circuit is configured by use of the charge/discharge circuit disclosed in JP-A-2002-152015. The circuit 1 may be used as a preceding stage of a driver circuit of asynchronous serial communication to suppress the noise generation attributable to sharp signal variations on the communication line.

The circuit 1 includes transistors T1 and T2 respectively connected to constant current circuits 3 and 4. Together, transistors T1 and T2 constitute a current mirror circuit 2. A transistor T3, which operates as the above-mentioned switch circuit, is connected in parallel to the transistor T1. The transistor T3 is turned on and off by an input voltage signal Vin, which is derived in level from the reception signal. A capacitor C1 is connected in parallel to the transistor T2. A logical bi-leveling circuit 5, which causes a signal to have two logical levels, receives a voltage Vc across the capacitor C1 and generates a 2-level output voltage signal Vo. The constant current circuits 3 and 4 are designed such that the output current I1 of circuit 3 is twice the output current I2 of circuit 4.

In operation, when the input voltage Vin turns from a low to a high level, the transistor T3 turns on and transistors T1 and T2 turn off, which causes the capacitor C1 to be charged by the output current I2 of the constant current circuit 4. Consequently, the output voltage Vo rises at a constant rate. When the input voltage Vin turns from a high to a low level, the transistor T3 turns off and transistors T1 and T2 turn on, causing the capacitor C1 to be discharged by a differential current (I1-I2) between the current I1 flowing through the transistor T2 and the output current I2 of the constant current circuit 4. Consequently, the output voltage Vo falls at a constant rate.

However, the resulting output voltage Vo having a trapezoidal waveform will include many harmonic components created at level transitions of the input voltage Vin. Therefore, when this circuit is used for a vehicle on-board network it may not be able to suppress noise generation interfering with the on-board radio.

FIG. 14 shows the signal waveforms of the circuit 1. More particularly, FIG. 14 shows: (a) input voltage Vin, (b) capacitor C1 voltage Vc, and (c) output voltage Vo of the bi-leveling circuit 5. The capacitor voltage Vc immediately falls to a negative voltage −VF (VF: base-emitter voltage) when the input voltage Vin rises from the low level to the high level and thereafter Vc progressively rises. This voltage fall is caused by base-to-collector coupling attributed to the base-collector capacitance Cbc (shown by the dotted line in FIG. 13) of transistor T2. A variation of base voltage results directly in a variation of collector voltage.

Accordingly, a time difference ta emerges from the initial time at which the input voltage Vin makes a low-to-high transition and the time at which the capacitor voltage Vc rises to the rising threshold voltage V TH (3 V) of the bi-leveling circuit 5. A time difference tb also emerges from the time at which the input voltage Vin makes a high-to-low transition and the time at which the capacitor voltage Vc falls from 5 V to the falling threshold voltage VTL (2 V) of the circuit 5. Consequently, not only is there a delay between the output voltage Vo and the input voltage Vin, but the waveform also differs from Vin. This delay and waveform difference may cause a data reception error at the reception register, which is the next stage of the bi-leveling circuit 5.

The above-mentioned case demonstrates the need of control for equalizing the rise time and fall time of a signal, More generally, a filter circuit is needed for accurately settling the time discordant characteristics in terms of signal rising/falling time span between the input and output signals.

SUMMARY OF THE INVENTION

Accordingly, it is an object to provide a transceiver that can produce a trapezoidal waveform with decreased harmonic components in the output signal.

Accordingly, it is also an object to provide such a transceiver that can eliminate or significantly limit noise superimposed on the communication signal while accurately retaining a signal time-wise structure.

Accordingly, it is also an object to provide the transceiver to be capable of accurately settling the discordance in terms of signal rising/falling time span between the input and output signals having two logical levels as well as eliminating the noise of input signal in this state.

In view of the above objects, a transceiver includes an improved trapezoidal wave signal generation circuit and an improved filter circuit.

The trapezoidal wave signal generation circuit is operative so that when a waveform control signal is at a first level, the capacitor is discharged by a differential current between a discharge current produced by the second current output circuit and a charge current produced by the first current output circuit (half as much as the discharge current or equal to the charge current), and the voltage across the capacitor falls depending on the value of the discharge current. When the waveform control signal is at a second level, the capacitor is charged by the charge current produced by the first current output circuit, and the capacitor voltage rises depending on the value of the charge current.

The trapezoidal wave signal generation circuit includes a current control circuit that controls the charge/discharge currents based on the comparison of the capacitor voltage with multiple preset threshold voltages such that the smaller the difference of the capacitor voltage from the voltage of the first or second power line, the smaller are the charge/discharge currents. Accordingly, in response to a level variation of the waveform control signal, the voltage variation rate at the beginning of rise or fall of the capacitor voltage (trapezoidal wave signal) progressively increases, and the voltage variation rate at the subsequent end of rise or fall of the capacitor voltage progressively decreases.

In consequence, the rate of change of the capacitor voltage does not vary sharply (i.e., has a smaller second-degree derivative of the capacitor voltage), in contrast to the conventional trapezoidal wave signal in which a spike emerges at the beginning of voltage rise or fall and at the end of voltage rise or fall, whereby harmonic components included in the trapezoidal wave signal can be minimized. The threshold voltages are produced by basing the reference on voltages of the first power line and second power line, and a trapezoidal wave signal having always a smooth waveform pro file can be obtained even in the presence of the power voltage fluctuation.

The current control circuit increases or decreases the charge/discharge currents at an increment or decrement of a certain reference current each time the capacitor voltage exceeds any of the threshold voltages. This approach allows the use of transistors of the same size in fabricating the circuit as a semiconductor integrated circuit, and it is advantageous in achieving a high current accuracy.

The threshold voltages produced by the first threshold voltage generation circuit and the threshold voltages produced by the second threshold voltage generation circuit are symmetric in value across the center voltage of the first and second power lines. Consequently, the trapezoidal wave signal is symmetric between the high-voltage side and low-voltage side across the center voltage, whereby the waveform distortion can further be reduced.

The trapezoidal wave signal generation circuit includes multiple diodes connected in series between the first and second power lines, with threshold voltages being released from the nodes of diodes. Due to a constant current flowing through these diodes, the variation of the threshold voltages, which are based on the first and second power lines can be alleviated when the power voltage fluctuates. In an asynchronous serial communication transmitter, for example, when a diode or a base-emitter junction of a transistor is connected between the output terminal of the driver circuit and the first power line or second power line, the trapezoidal wave signal generation circuit and the driver circuit operate in concert with each other inclusive of the case of forward voltage variation in response to the temperature variation.

A first plurality (three) of threshold voltages, which are different in steps by the amount of the forward voltage VF of pn junction, are produced by basing the reference on the voltage of the first power line. A second plurality (three) of threshold voltages, which are different in steps by the amount of forward voltage VF, are produced by basing the reference on the voltage of the second power line. It is conceived that the more the trapezoidal wave signal in variation approximates a sinusoidal wave, the smaller the amount of harmonic components that will be included in the waveform. For the trapezoidal wave signal generation circuit having no timing means, approximation of waveform to a sinusoidal wave based on time is not admissible, but a practical approach is approximation to a sinusoidal wave based on threshold voltages which are set at constant intervals. A simulation-based assessment conducted by the inventors has revealed that harmonic components can be reduced to the extent of practical satisfaction based on the 6-point waveform approximation when the power voltage is 8 V.

The transceiver includes a driver circuit for sending transmission data carried by a trapezoidal wave signal, which complies with a certain standard, over a communication line, whereby the noise emission from th e driver circuit and communication line can be alleviated.

The improved filter circuit is preferably implemented within a receiver circuit. The filter circuit includes first and second transistors, which constitute a current mirror circuit, with the control electrode voltage of the transistors varying sharply in response to a transition of level of an input signal having two logical levels, causing the first and second transistors to turn on or off. In case the first and second transistors are conductive in the absence of restriction on their joined control electrodes, the second transistor has a current capacity which is twice that of a second constant current circuit connected in series to a filtering capacitor. The filtering capacitor is discharged by a current equal to the difference between the current conducted by the second transistor and the output current of the second constant current circuit. By this discharging, the voltage across the filtering capacitor falls not to 0 V, but down to an offset voltage produced by an offset voltage generation circuit.

When the voltage of the joined control electrodes (e.g., bases) falls in response to a transition of the input signal level, the collector voltage is pulled down due to the base-collector capacitive coupling, and the filtering capacitor voltage also falls by way of the offset voltage generation circuit. In this case, the filtering capacitor in its discharged state is up-leveled from 0 V by the amount of offset voltage to thereby allow a voltage fall caused by the capacitive coupling, and therefore the capacitor voltage falls from the offset voltage down to about 0 V. The first and second transistors are off due to the voltage fall of their joined control electrodes, and the filtering capacitor is charged from about 0 V by the output current of the second constant current circuit.

Consequently, the time expended for the capacitor voltage to rise up to a certain voltage after the filtering capacitor has turned from discharging to charging includes scarcely an error attributable to the presence of the base-collector capacitance. Accordingly, based on the proper setting of the ratio (N) of the second transistor current vs. the second constant current circuit output current and the threshold levels for the filtering capacitor voltage, it is possible to settle accurately as intended the difference in rise time between the input signal and the output signal and the difference in fall time between the input signal and the output signal, and the filter circuit eliminates the noise of input signal in this state. The above-mentioned function and effectiveness are equally attained even in case FETs are used for the transistors.

The filter circuit has its offset voltage set to be equal to the voltage variation width of the joined control electrodes, which is derived from the voltage variation of the input signal. A voltage fall of the filtering capacitor voltage in response to a voltage fall of the joined control electrodes increases with the decrease of capacitance of the filtering capacitor, and it is eventually equal to a voltage fall of the joined control electrodes. Accordingly, this approach can minimize the discordance of level transitive times of the output signal from the input signal when the filtering capacitor cannot have a large capacitance due to a limited area on the IC chip.

The filter circuit has its offset voltage generation circuit formed of a transistor of the same type as the first transistor, with the base and collector (gate and drain in the case of FET) of the transistor being connected to each other. Accordingly, the variation width of the base-emitter voltage (gate-source voltage in the case of FET) of the first transistor, which is derived from the voltage variation of the input signal, is equal to the offset voltage produced by the offset voltage generation circuit.

The improved filter circuit has its logical bi-leveling circuit adapted to compare the filtering capacitor voltage with a first threshold voltage at the charge of the capacitor or compare with a second threshold voltage at the discharge of the capacitor. The filtering capacitor voltage falls to about 0 V and then progressively rises at the charge as mentioned previously, and it is possible to settle accurately the time span after the input signal makes a level transition until the filtering capacitor voltage rises up to the first threshold voltage and the time span after the input voltage makes a level transition until the filtering capacitor voltage falls from the full-charge voltage down to the second threshold voltage in accordance with the ratio (N) of the second transistor current vs. the second constant current circuit output current.

The improved filter circuit has its second constant current circuit adapted to produce a constant current which is a half the constant current flowing through the second transistor, which makes equal the delays of the rising edge and falling edge between the input and output signals, and the filter circuit eliminates the noise of input signal by being virtually free from the level transitive time discordance between the input and output signals.

The communication receiver includes the filter circuit for eliminating the noise from a 2-level signal generated by a waveform shaping circuit. The filter circuit does not have the discordance in terms of signal transitive time span, although the output signal has a delay from the input signal, and accordingly it can prevent the occurrence of data error at the input to the reception register.

The transceiver is intended for use in a vehicle on-board communication network based on the Local Interconnect Network (LIN), and a resulting reduced communication error allows the stable and high quality communication.

BRIEF DESCRIPTION OF THE DRAWINGS

The above and other objects, features and advantages of the present invention will become more apparent from the following detailed description made with reference to the accompanying drawings. In the drawings.

DESCRIPTION OF THE PREFERRED EMBODIMENT

Referring first to the block diagram of FIG. 1, a preferred embodiment will be discussed with reference to an exemplary case in which the present invention is implemented within a transceiver integrated circuit (IC) 11 of a vehicle on-board network.

The transceiver IC 11 is mounted on a circuit board in an Electronic Control Unit (ECU) that controls the vehicle body system including the doors, mirrors, roof window, sheets, wipers, meters, and air conditioner. A control IC (not shown) incorporating a CPU is also mounted on the circuit board. The transceiver IC 11, in unison with transceiver ICs in other ECUs and a communication line (LIN bus), organizes a vehicle on-board network.

The vehicle control system employs communication protocols of a Controller Area Network (CAN) for the body system sections needing high-speed communication (up to 1 Mbps) and generally employs a Local Interconnect Network (LIN) for other body system sections not needing the high-speed communication. The LIN, which is based on UART/SCI, is advantageous in building a communication system at a low cost. It adopts the single wire scheme resulting from the expansion of ISO9141 and the single-master/slave scheme, thereby achieving a highest data rate of 20 kbps and a thru-rate of 1 to 3 v/μs.

Figure 1:
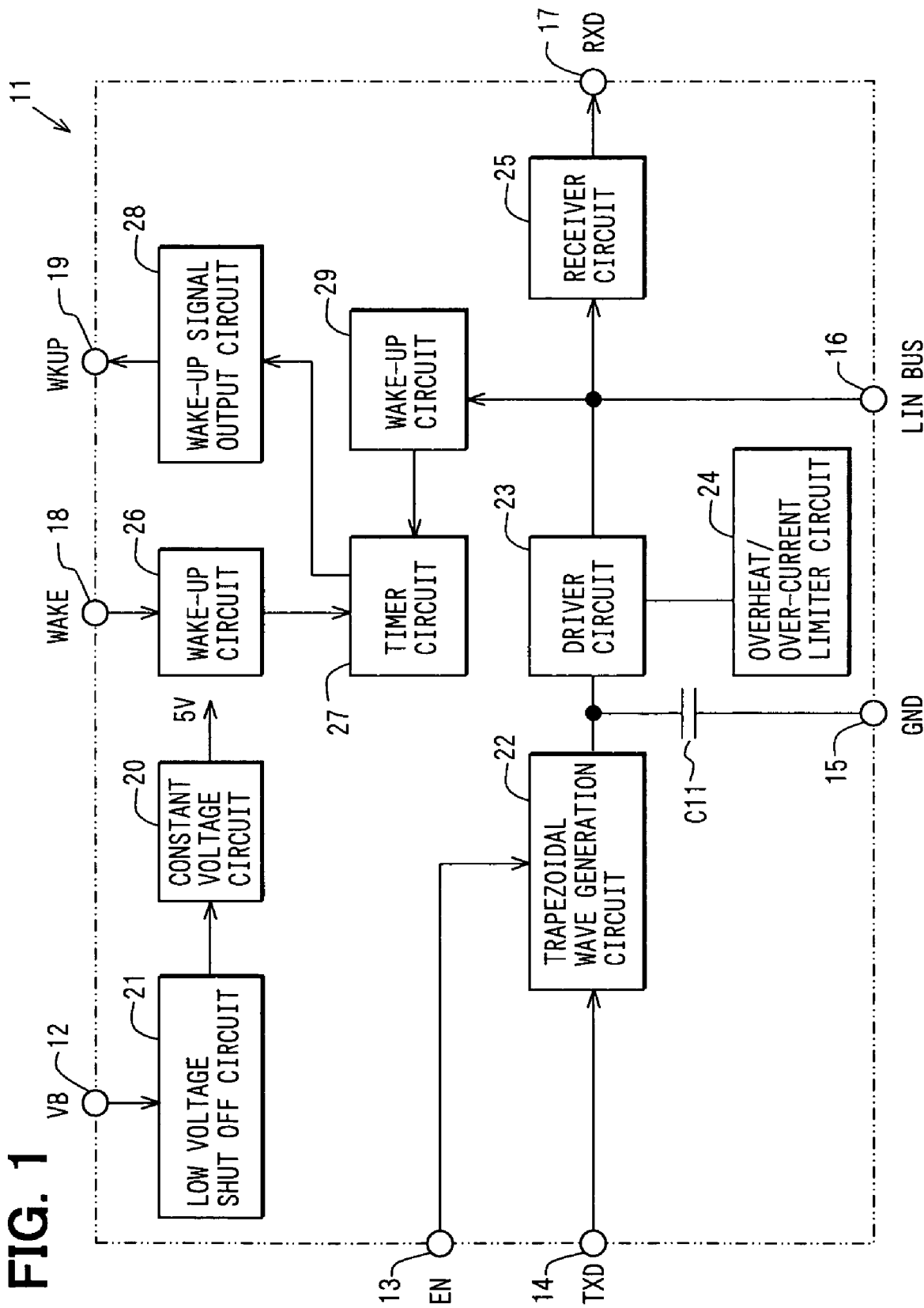
FIG. 1 is a block diagram of a transceiver integrated circuit.

Referring to the block diagram of FIG. 1, the transceiver IC 11 will be more fully discussed. The transceiver IC 11 includes (eight) terminals 12-19. The transceiver IC 11 also includes a plurality of functional blocks such as a constant voltage circuit 20, a low voltage shut off circuit 21, a trapezoidal wave generation circuit 22, a driver circuit 23, an overheat/over-current limiter circuit 24 and a receiver circuit 25. The transceiver IC 11 may also optionally include a first wake-up circuit 26, a timer circuit 27, a wake-up signal output circuit 28 and a second (or another) wake-up circuit 29. Operation of the transceiver IC 11 will be more fully explained below.

The transceiver IC 11 is supplied battery voltage VB by terminal 12 to produce a power supply voltage Vcc from the battery voltage VB by the constant voltage circuit 20. All of the functional blocks except for the trapezoidal wave voltage generation circuit 22 and driver circuit 23 operate based on this power supply voltage Vcc. The low voltage shut off circuit 21 detects when the battery voltage VB falls below a prescribed voltage (e.g., 6 V) and turns off the constant voltage circuit 20 when such a detection is made.

The trapezoidal wave generation circuit 22 (i.e., trapezoidal wave signal generation circuit) operates, when it receives an enable signal EN from terminal 13, to produce a trapezoidal wave signal having the above-mentioned thru-rate in response to incoming transmission data TXD received from the control IC via terminal 14. The purpose of the trapezoidal wave signal is to alleviate the creation of radio noise. The trapezoidal wave generation circuit 22 will be discussed more fully below.

The driver circuit 23 delivers the trapezoidal wave signal to the LIN bus via the LIN bus connection to terminal 16. The driver circuit 23 has sufficient driving capacity to drive an LIN bus connected to a maximum of 15 transceiver ICs. The driver circuit 23 includes the associated overheat/overcurrent limiter circuit 24. The trapezoidal wave voltage generation circuit 22 and driver circuit 23 constitute a transmitter of asynchronous serial communication.

The receiver circuit 25 receives asynchronous serial communication data over the LIN bus and releases the received data RXD via the terminal 17 to the control IC.

In addition to these fundamental functions, the transceiver IC 11 can have its operational mode switched between a normal operation mode and a low power consumption mode (or sleep mode). In the sleep mode, the wake-up circuit 26 activates the timer circuit 27 when it receives a signal via terminal 18 from an external switch or the like. On expiration of a prescribed time counted by the timer circuit 27 in the presence of the signal on the terminal 18, the timer circuit 27 returns the transceiver IC 11 from the sleep mode to normal operation mode. At this time, a wake-up signal output circuit 28 outputs a wake-up signal WKUP, which is delivered via the terminal 19 to the control IC. A second (another) wake-up circuit 29 responds to the low level transition of the LIN bus to activate the timer circuit 27 for releasing the wake-up signal WKUP.

Figure 2:
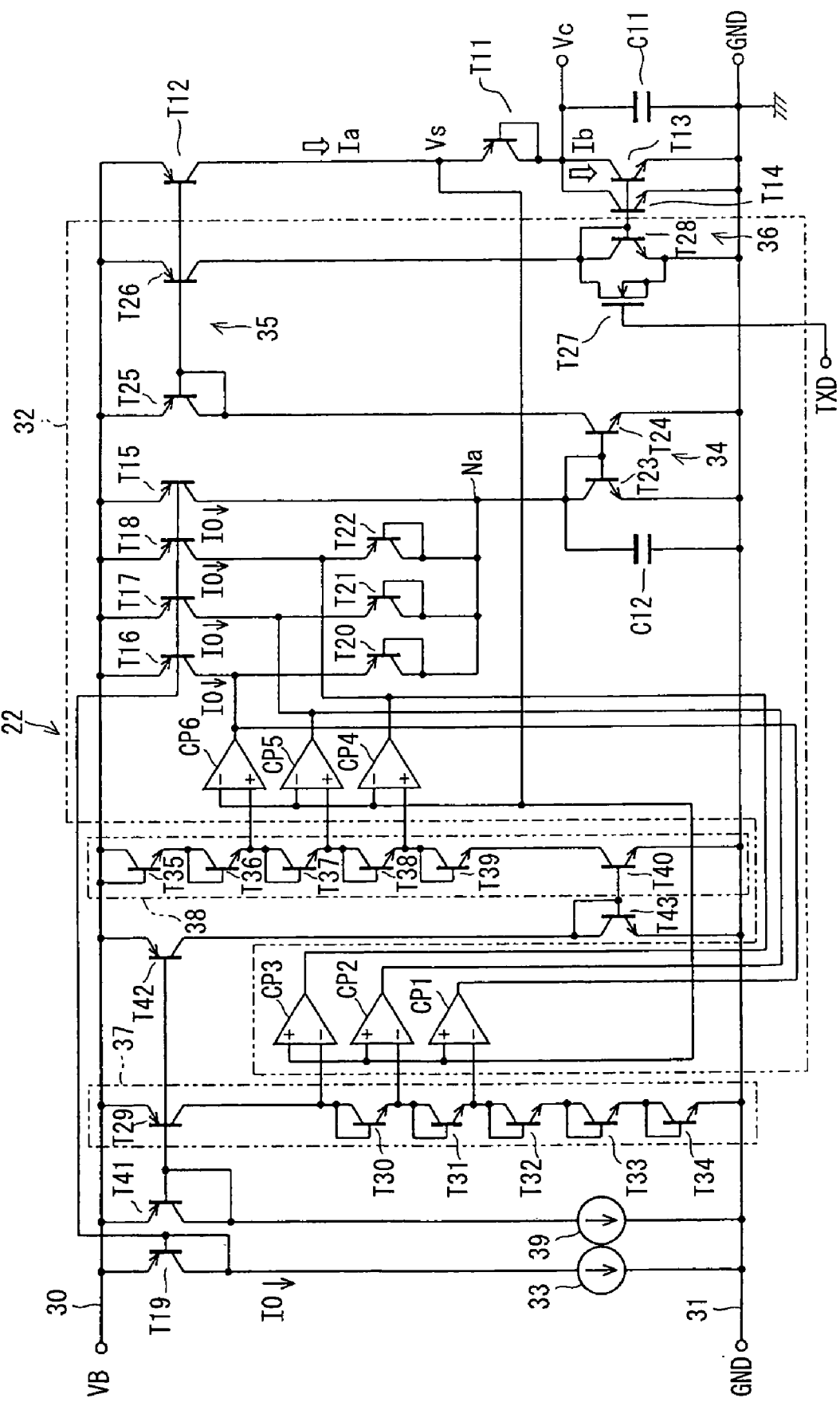
FIG. 2 is a schematic circuit diagram of the trapezoidal wave voltage generation circuit according to a preferred embodiment.

Referring to FIG. 2, the circuit arrangement of the trapezoidal wave voltage generation circuit 22 will be discussed. The above-mentioned enable signal EN is not shown for ease of illustration. The power voltage VB is supplied between a power supply line 30 (i.e., second power line) and a power supply line 31 (i.e., first power line). A trapezoidal wave signal is produced as voltage Vc across a capacitor C11 in response to a low or high level of the transmission data TXD.

The capacitor C11 has one terminal connected to the power supply line 31 and another terminal connected to the power supply line 30 through transistors T11 and T12. Transistor T11 has its emitter and base connected to each other. The transistor T12 functions as a first current output circuit for feeding a charge current Ia to the capacitor C11. Transistors T13 and T14 are connected in parallel between the terminals of the capacitor C11. These transistors T13 and T14 together as a pair function as a second current output circuit for feeding a discharge current Ib that is twice the size of the charge current Ia.

A current control circuit 32 controls the values of the charge current Ia and the discharge current Ib. The current control circuit 32 includes a plurality of transistors T15-T18, each of which has an emitter connected to the power supply line 30. The transistors T15-T18 form a current mirror circuit with transistor T19 to thereby conduct a current equal to the output current I0 of a constant current circuit 33 connected in series to the transistor T19. The transistors T16-T18 have their collectors connected to a node Na via respective transistors T20-T22, which are each connected. As a result, transistors T16-T18 function as diodes for blocking reverse currents. The transistor T15 has its collector connected directly to the node Na.

A transistor T23 having a base and collector connected together is connected in parallel with capacitor C12. The transistor T23 and capacitor C12 are connected between the node Na and the power supply line 31. The transistor T23 in unison with a transistor T24 constitute a current mirror circuit 34. A transistor T25 also having a base and collector connected together is connected between the transistor T24 and the power supply line 30. The transistors T25, T12 and T26 constitute current mirror circuit 35.

A MOS transistor T27 and a transistor T28 are connected in parallel between the transistor T26 and the power supply line 31. The transistors T28, T13 and T14 constitute a current mirror circuit 36. The MOS transistor T27 is adapted to receive the transmission data TXD, which behaves as a waveform control signal, on its gate electrode.

Among the transistors T15-T18, the output current from transistor T15 always flows to the transistor T23 via node Na while the output currents from transistors T16-T18 flow to the transistor T23 by being controlled by six comparators CP1-CP6 having open-collector outputs. Specifically, the comparators CP1 and CP6, the comparators CP2 and CP5, and the comparators CP3 and CP4 in pairs have their output terminals connected to the transistors T16, T17 and T18, respectively, so that a conductive output transistor among the comparators CP1-CP6 draws in the output current of the corresponding transistor T16-T18.

The comparators CP1, CP2 and CP3 have their non-inverting input terminals supplied with the emitter voltage Vs (Vs=Vc+VF) of the transistor T11 and their inverting input terminals supplied with threshold voltages provided by a threshold voltage generation circuit 37 (i.e., first threshold voltage generation circuit). The threshold voltage generation circuit 37 includes a transistor T29 and transistors T30-T34, each of which is connected to function as a diode. Transistors T29-T34 are connected together in series between the power supply lines 30 and 31.

The threshold voltages are the collector voltages of the transistors T32, T31 and T30, having values of Vr1=3·VF, Vr2=4·VF and Vr3=5·VF, where VF is the base-emitter voltage (pn junction forward voltage) of the transistors T30-T34, in the case of comparison with the voltage Vs, or having values of Vr1=2·VF, Vr2=3·VF and Vr3=4·VF in the case of comparison with the voltage Vc.

The purpose of the transistor T11 is to block the outflow of internal bias current from the comparators CP1-CP6, which have an input section of 1-stage pnp-type transistor, from the input terminal. In the case of comparators CP1-CP6 having a 2-stage input section, the transistor T11 is not required and the transistor T34 of the threshold voltage generation circuit 37 may be removed.

The comparators CP4, CP5 and CP6 have their inverting input terminals supplied with the voltage Vs and their non-inverting input terminals supplied with threshold voltages provided by a threshold voltage generation circuit 38 (i.e., second threshold voltage generation circuit). The threshold voltage generation circuit 38 includes a transistor T40 and transistors T35-T39, each of which is connected to function as a diode, connected in series between the power supply lines 30 and 31.

The threshold voltages are the collector voltages of the transistors T38, T37 and T36, having values of Vr4=VB−4·VF, Vr5=VB−3·VF and Vr6=VB−2·VF.

The transistors T29 and T40 function as constant current circuits. A transistor T41 and a constant current circuit 39 are connected in series between the power supply lines 30 and 31, and the transistor T41 in unison with the transistor T29 and transistor T42 constitute a current mirror circuit. Another transistor T43 is connected between the transistor T42 and the power supply line 31. The transistor T43 in unison with the transistor T40 constitute a current mirror circuit. Accordingly, the transistors T29-T40 conduct a current equal to the output current of the constant current circuit 39 so that the threshold voltages do not vary when the power voltage VB fluctuates.

Figure 3:
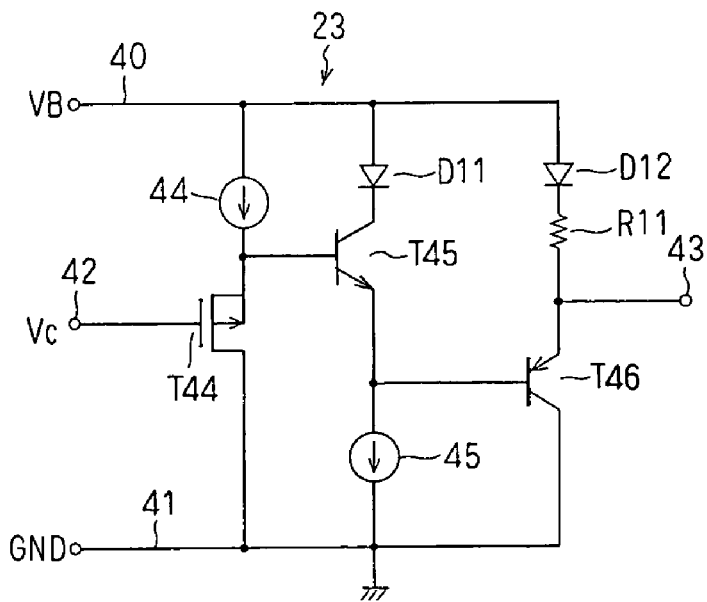
FIG. 3 is a schematic circuit diagram of the driver circuit.

FIG. 3 shows schematically the circuit arrangement of the driver circuit 23. The power voltage VB is supplied between the power supply lines 40 and 41 of the driver circuit 23. The capacitor voltage Vc across the capacitor C11 in the trapezoidal wave voltage generation circuit 22 is given between the terminal 42 and the power line 41. The driver circuit 23 has its output terminal 43 connected to the LIN bus by way of the terminal 16 of the transceiver IC 11.

The terminal 42 is connected to the gate of a MOS transistor T44. The MOS transistor T44 has its drain connected to power supply line 41 and its source connected to the power supply line 40 through a constant current circuit 44. The source is also connected to the base of a transistor T45. The transistor T45 has its collector connected to the power supply line 40 through a diode D11 and its emitter connected to the power supply line 41 through another constant current circuit 45. The emitter is also connected to the base of a transistor T46. The transistor T46 has its emitter joined to the output terminal 43 and also connected to the power supply line 40 through a resistor R11 and a diode D12. The transistor T46 has its collector connected to the power supply line 41.

Next, the operation of this embodiment will be explained with reference to FIGS. 4A-9. When the transceiver IC 11 is in sleep mode, the voltage supply from the constant voltage circuit 20 to the trapezoidal wave generation circuit 22, driver circuit 23 and receiver circuit 25 is shut off and it cannot send or receive data. Operation of the transceiver IC 11 during normal operation mode will be discussed below.

The LIN bus receives and transmits a communication signal that is a trapezoidal wave signal having a prescribed thru-rate of 1–3 V/μs in order to reduce the creation of radio noise. When the transmission data TXD is at a low level (i.e., first level), the transistor T27 is off and the transistors T13 and T14 in unison conduct a discharge current Ib twice the size of the current flowing through the transistors T26 and T28. The transistor T12 conducts a charge current Ia equal to the current flowing through the transistor T26, causing the capacitor C11 to be discharged by a current equal to: Ib−Ia=Ia=Ib/2, and the capacitor voltage Vc falls at a slope depending on the value of Ib-Ia.

When the transmission data TXD turns to a high level (i.e., second level), the transistor T27 turns on and the transistors T13 and T14 turn off. Consequently, the capacitor C11 is charged by a charge current Ia, and the capacitor voltage Vc rises at a slope depending on the value of charge current Ia. The capacitor voltage Vc is detected as voltage Vs (Vs=Vc+VF) by the transistor T11. The comparators CP1-CP6 receive the same potential Vs.

Figure 7:
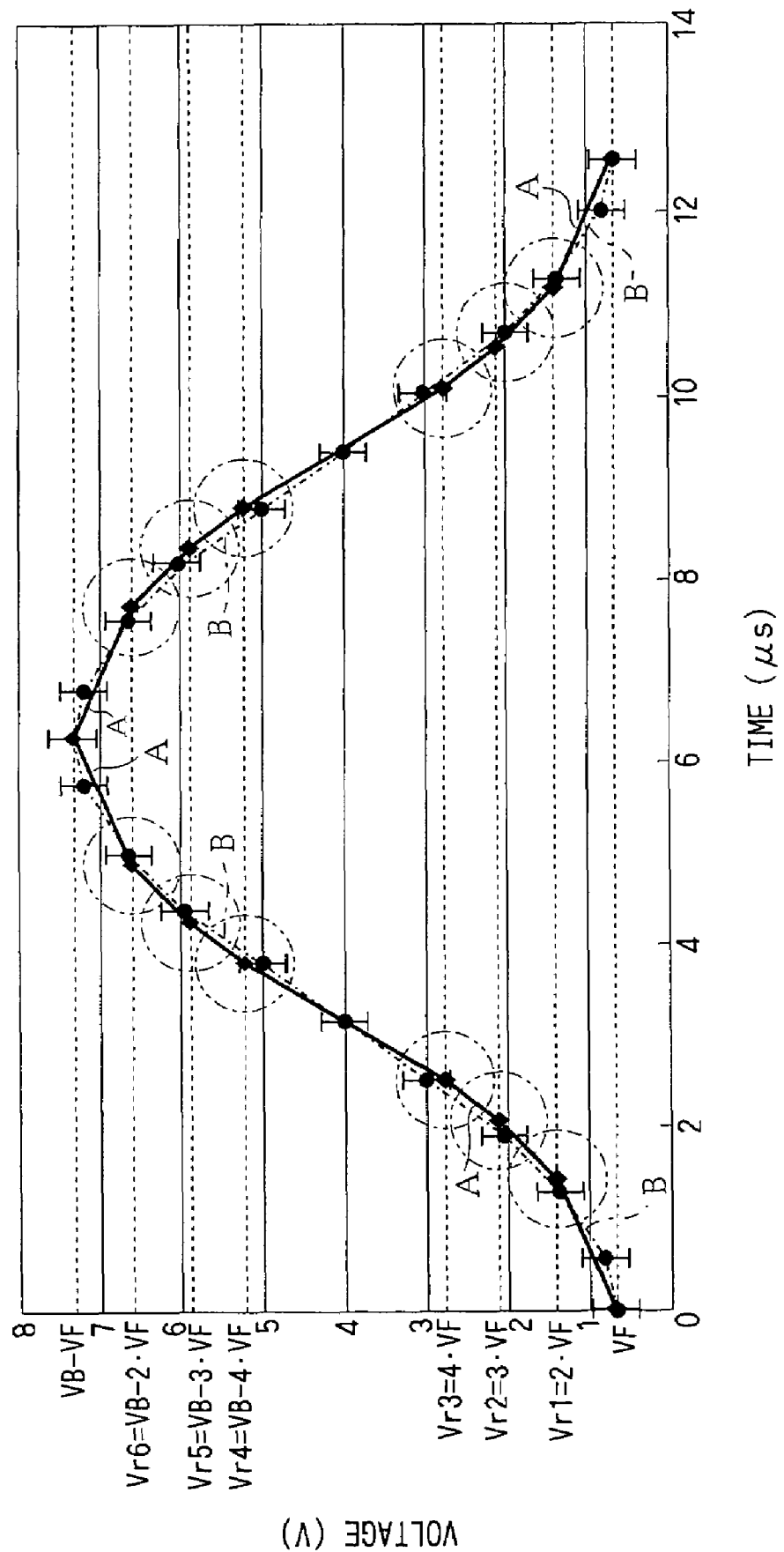
FIG. 7 is a voltage waveform diagram of the case of six threshold voltages.

The variation rate of the charge current Ia, i.e., capacitor voltage Vc, is controlled by the current control circuit 32. FIG. 7 shows the waveform of the capacitor voltage Vc when the transmission data TXD turns from low to high level (from time 0 to time 6.3 μs) and from high to low level (from time 6.3 μs to 12.6 μs). The power voltage VB is 8 V. While the voltage Vc is lower than 2·VF, all output transistors of the comparators CP1-CP3 are on, and all output transistors of the comparators CP4-CP6 are off. The output currents I0 of the transistors T16-T18 flow through the output transistors of the comparators CP1-CP3, and accordingly the current flowing from the node Na to the transistor T23, i.e., the charge current Ia conducted by the transistor T12, is solely the current I0 conducted by the transistor T15.

Subsequently, when the capacitor voltage Vc rises to reach the threshold voltage Vr1 (i.e., 2·VF), the output transistor of the comparator CP1 turns from on to off, causing the charge current Ia to increase up to 2·I0 conducted by the transistors T15 and T16. When the voltage vc further rises to reach the threshold voltage Vr2 (i.e., 3·VF), the output transistor of the comparator CP2 turns off, causing the charge current Ia to become 3·I0 conducted by the transistors T15-T16. When the voltage Vc further rises to reach the threshold voltage Vr3 (i.e., 4·VF), the output transistor of the comparator CP3 turns off, causing the charge current Ia to become 4·I0 conducted by the transistors T15-T18.

When the voltage vc further rises to reach the threshold voltage Vr4 (i.e., VB−4·VF), the output transistor of the comparator CP4 turns from off to on, causing the output current of the transistor T18 to flow through the output transistor of the comparator CP4. Consequently, the charge current Ia decreases to current 3·I0 conducted by the transistors T15-T17. When the voltage Vc further rises to reach the threshold voltage Vr5 (i.e., VB−3·VF), the output transistor of the comparator CP5 turns on, causing the charge current Ia to become 2·I0 conducted by the transistors T15 and T16. When the voltage Vc further rises to reach the threshold voltage Vr6 (i.e., VB−2·VF), the output transistor of the comparator CP6 turns on, causing the charge current Ia to become I0 conducted by the transistor T15. Control of the charge/discharge currents Ia and Ib when the transmission data TXD turns from high to low level is identical to the foregoing control of charge current Ia. By connecting a capacitor C12 between the node Na and the power supply line 31, it becomes possible to absorb the discontinuity of current occurring at the switching between the charge current Ia and discharge current Ib.

The trapezoidal wave voltage Vc produced from the transmission data TXD is sent to the driver circuit 23 so that a signal having the same waveform as Vc is sent out over the LIN bus. The output signal of the driver circuit 23 has an upper limit voltage VB−VF due to the presence of the diode D12 and has a lower limit voltage VF due to the presence of the transistor T46. When the forward voltage VF varies in response to temperature variation, these upper and lower limit voltages also vary.

According to this embodiment, the threshold voltage generation circuits 37 and 38 of the trapezoidal wave voltage generation circuit 22 produce the threshold voltages by basing the reference on the forward voltage VF. Therefore, the temperature-dependent variations of the voltage Vc produced by the trapezoidal wave voltage generation circuit 22 and the upper and lower limit voltages produced by the driver circuit 23 are fairly consistent. Accordingly, a distorted waveform is rarely generated.

Figure 4A:
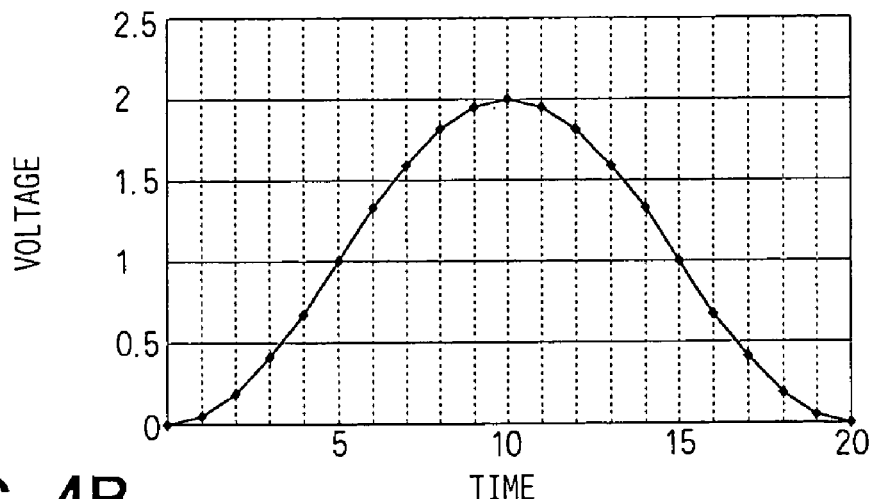
FIGS. 4A and 4B are waveform diagrams showing the voltage waveforms resulting from the variation of the charge/discharge currents at constant time intervals and constant voltage intervals, respectively.
Figure 4B:
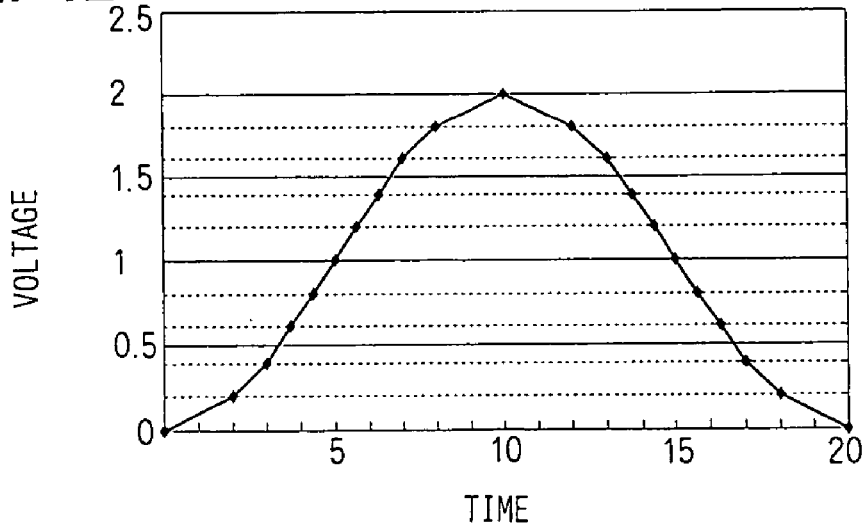

Next, the basis of the foregoing values of threshold voltages will be explained. Noise emission will be caused by harmonic components included in the trapezoidal wave signal sent over the LIN bus. Therefore, the output signal variation on the LIN bus, i.e., the variation of voltage Vc across the capacitor C11, at level transitions of transmission data TXD should be as smooth as possible and preferably within the allowable range of thru-rate standard (1–3 V/μs). Making the rising and falling waveform of the voltage Vc approximate a sinusoidal wave effectively attains this condition. A first approach for generating a sinusoidal wave based on discrete control involves controlling the slope of voltage Vc by changing the charge/discharge currents Ia and Ib of the capacitor C11 at constant time intervals. A second approach involves controlling the slope of voltage Vc by changing the charge/discharge currents Ia and Ib of the capacitor C11 at constant voltage intervals. FIGS. 4A and 4B show voltage waveforms produced by the first and second approaches. The waveforms are plotted on the vertical axis of normalized voltage against the horizontal axis of normalized time. Plotted from time 0 to time 10 is the rising section of the trapezoidal wave and plotted from time 10 to time 20 is the falling section of the trapezoidal wave.

The variation rate of a sinusoidal wave decreases near its peak values. Therefore, the control approach based on constant voltage intervals is liable to make edges (sharp slop variations) of waveform at the beginning and end of voltage change as shown in FIG. 4B. On the other hand, the control approach based on constant time intervals requires a timer means and clock generation means and imposes additional problems resulting from clock noise generation. A voltage slope control approach based on the variation of charge/discharge currents at constant voltage intervals for a voltage Vc that closely approximates a sinusoidal wave by a practical circuit arrangement will now be discussed below.

Figure 5:
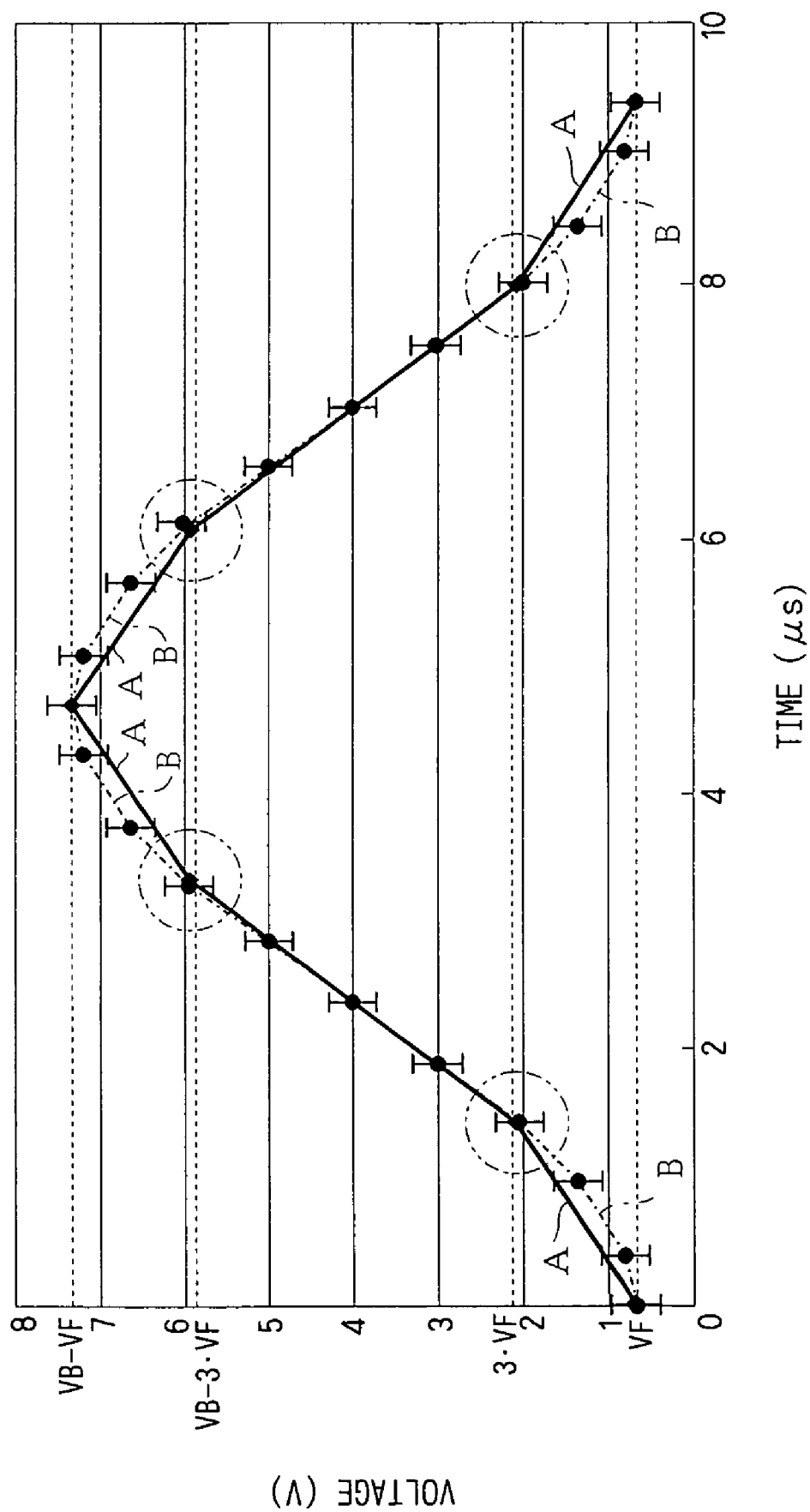
FIG. 5 is a voltage waveform diagram of the case of two threshold voltages.
Figure 6:
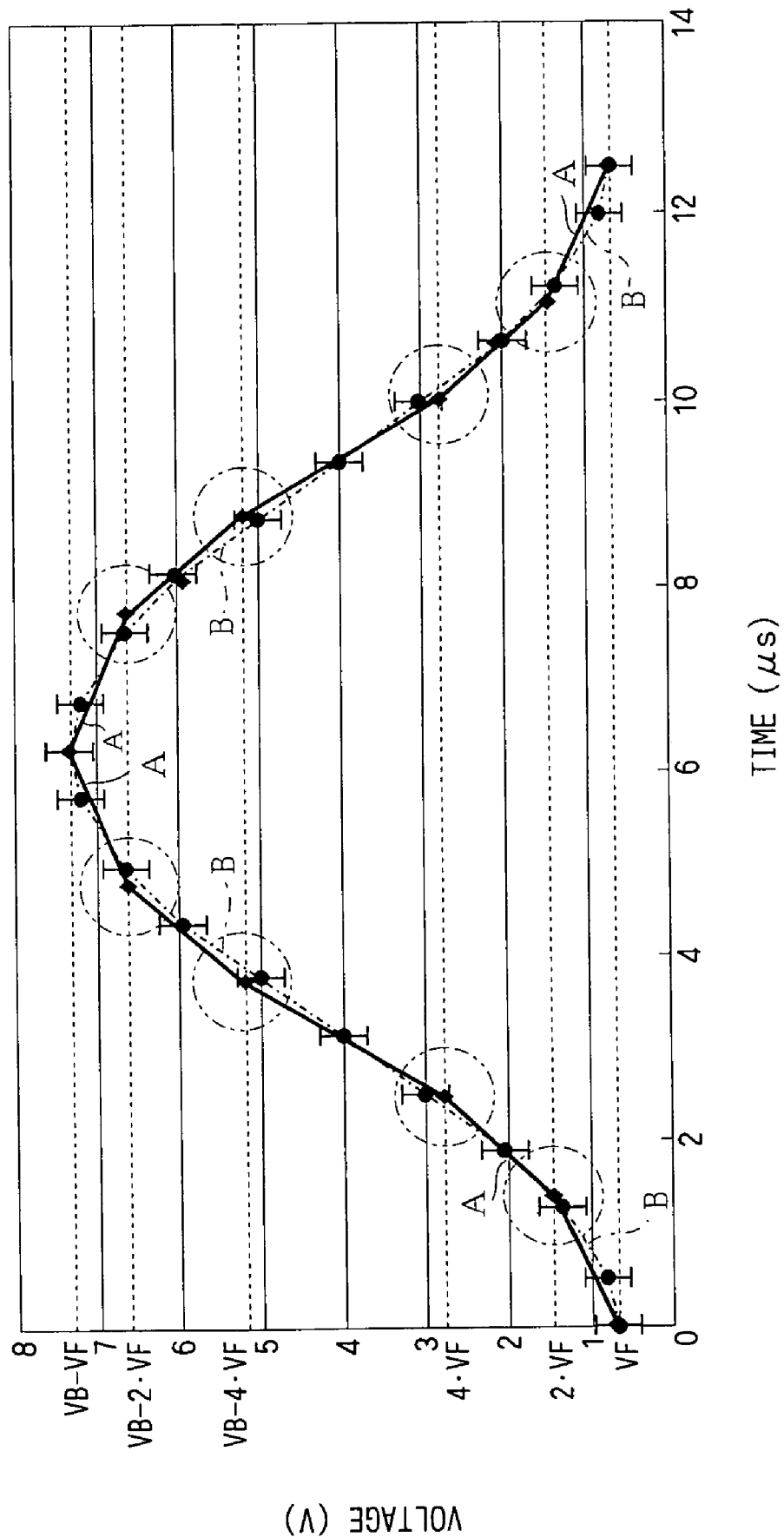
FIG. 6 is a voltage waveform diagram of the case of four threshold voltages.

FIGS. 5–7 show simulated waveforms of the voltage Vc based on two, four and six threshold voltages, respectively, at the voltage rise and fall when the power voltage VB is 8 V and the thru-rate is about 2 V/μs. The solid line (indicated by A) in each figure represents the voltage waveform resulting from control at constant voltage intervals. The dashed and dotted line (indicated by B) represents the voltage waveform resulting from control at constant time intervals. Marks of ±0.3 V range are attached to the constant time interval plot for scaling the deviation of waveform A from the waveform B, which is closer to the sinusoidal wave.

The simulation is performed when the charge/discharge currents Ia and Ib of the capacitor C11 increase or decrease by the amount of I0 each time the voltage Vc has reached each threshold voltage. This approach permits use of transistors T15-T18 having the same size and is also advantageous in enhancing current accuracy. The circuit arrangement shown in FIG. 2 corresponds to the threshold voltage setting of FIG. 7. The threshold voltages and waveform slopes shown in FIGS. 5, 6 and 7 are summarized as follows.

(1) Two threshold voltages (FIG. 5)
   Threshold voltages: 3·VF and VB−3·VF
   Charge/discharge current ratio: 1:2:1
(2) Four threshold voltages (FIG. 6)
   Threshold voltages: 2·VF, 4·VF, VB−4·VF and VB−2·VF
   Charge/discharge current ratio: 1:2:3:2:1
(3) Six threshold voltages (FIG. 7)
   Threshold voltages: 2·VF, 3·VF, 4·VF, VB−4·VF, VB−3·VF and VB−2·VF
   Charge/discharge current ratio: 1:2:3:4:3:2:1

The threshold voltages shown in FIGS. 5, 6 and 7 are symmetric across the center voltage (VB/2) of the power voltage VB. Consequently, the voltage Vc and the voltage on the LIN bus are symmetric between the higher voltage side and the lower voltage side across the center voltage so that the waveform distortion is smaller.

A comparative assessment of the waveforms illustrated by FIGS. 5, 6 and 7 results in the adoption of the waveform of FIG. 7 when the power voltage VB is 8 V. The waveform of FIG. 7 obtains a greater noise reduction effect than the conventional trapezoidal wave and the additional circuitry is within the allowable design range in comparison to the conventional circuit arrangement. However, an appropriate number of threshold voltages can be two, four, eight, or more, instead of six, depending on the allowable noise generation, the chip size and cost of transceiver IC 11, and the power voltage.

Figure 8:
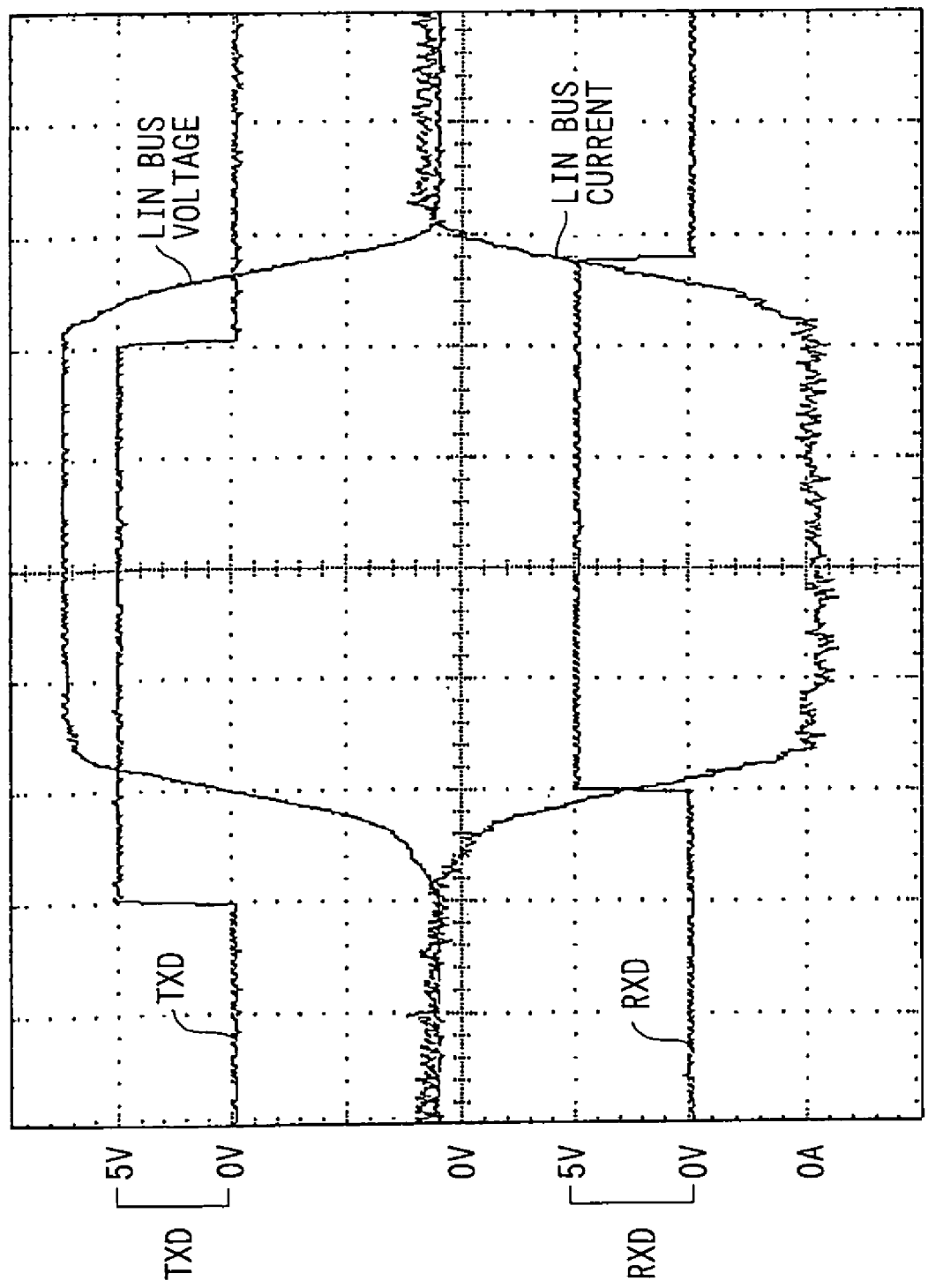
FIG. 8 is a diagram showing the voltage and current waveforms observed during communication.
Figure 9:
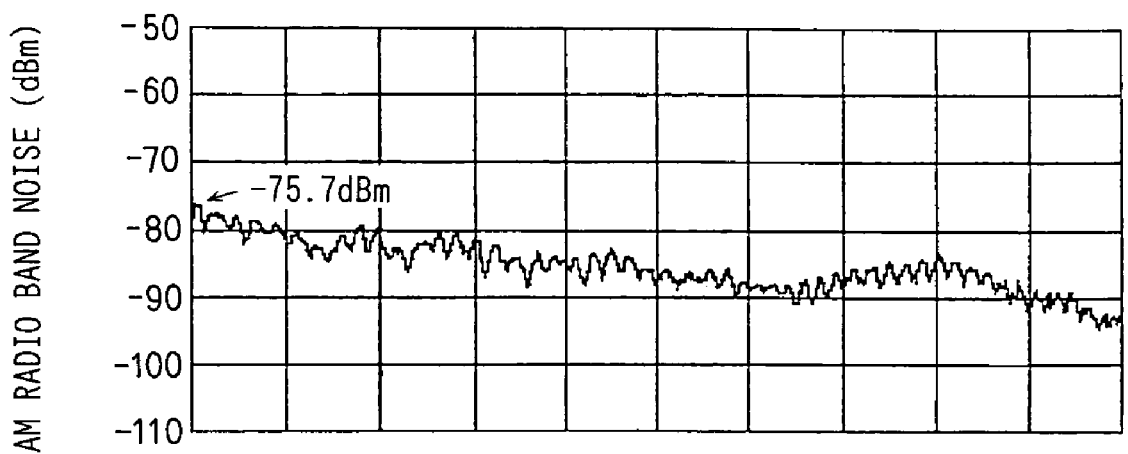
FIG. 9 is a graph showing the noise characteristics of the AM radio band.

FIG. 8 shows the voltage and current waveforms observed during communication by the transceiver IC 11, including the transmission data TXD, reception data RXD, LIN bus voltage, and LIN bus current. FIG. 9 shows the noise characteristics of the AM radio band measured at the output of the driver circuit 23. The measurement was conducted at room temperature, 18 V power voltage VB, 510 Ω LIN bus load, and at a communication speed of 20 kbps.

Although in FIG. 8 the LIN bus voltage does not have a sinusoidal waveform in response to the level transition of transmission data TXD due to the high power voltage VB of 18 V, the figure reveals a very smooth waveform of slopes in the portions near 0 V and power voltage VB, or at the beginning and end of voltage change. The bus voltage waveform is virtually symmetric between the voltage rise and fall. Noise generation in the AM radio band is alleviated by 5 dB to 10 dB as compared with the conventional performance.

As described above, the trapezoidal wave voltage generation circuit 22 of the transceiver IC 11 of this embodiment has threshold voltage generation circuits 37 and 38 for setting multiple threshold voltages, and operates based on the comparison of voltage Vc across the capacitor C11 with the threshold voltages so that the charge/discharge currents Ia and Ib are smaller as the capacitor voltage vc becomes closer to the lower limit voltage VF or the upper limit voltage VB−VF.

According to this control approach, the voltage variation rate at the beginning of the rise and fall of Vc increases progressively and the voltage variation rate at the end of rise and fall of Vc decreases progressively in response to the level transition of the transmission data TXD. Consequently, the variation rate of the LIN bus voltage which is produced by the driver circuit 23 does not vary sharply, and thus harmonic components included in the LIN bus voltage and current decrease, resulting in a smaller radio noise generation.

Symmetric setting of the threshold voltages across VB/2 minimizes the waveform distortion. A resulting symmetric waveform at the rise and fall of the LIN bus voltage meets the symmetrical waveform requirements for asynchronous serial communication. The threshold voltages below VB/2 are produced by basing the reference on 0 V, while the threshold voltages above VB/2 are produced by basing the reference on the power voltage VB, whereby the voltage Vc having a smooth waveform variation is obtained even in the presence of fluctuation of power voltage VB. The threshold voltages are produced by basing the reference on the forward voltage VF, whereby the waveform distortion caused by the temperature variation is alleviated.

The charge/discharge currents Ia and Ib are based on a summation of the output currents from the transistors T15-T18. These transistors T15-T18 have the same size, conduct the same current I0 and involve less characteristic disparity attributable to the manufacturing process, whereby the higher current accuracy can be attained.

Figure 10:
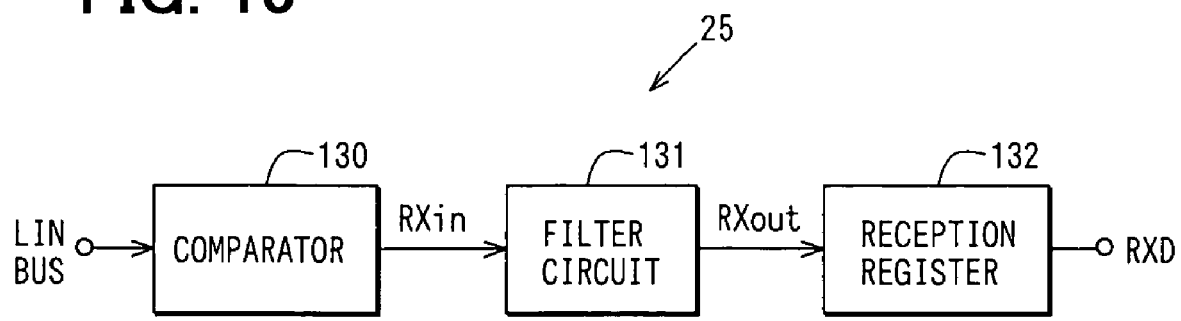
FIG. 10 is a brief block diagram of the receiver circuit.

Referring now to the brief block diagram of FIG. 10, the receiver circuit 25 will be discussed. The receiver circuit 25 includes, among other possible components, a comparator 130 (hysteresis i.e., waveform shaping circuit) for shaping the trapezoidal signal waveform received over the LIN bus to thereby logically bi-level the signal, a filter circuit 131 for releasing a resultant 2-level signal, and a reception register 132 for receiving the 2-level signal.

Figure 11:
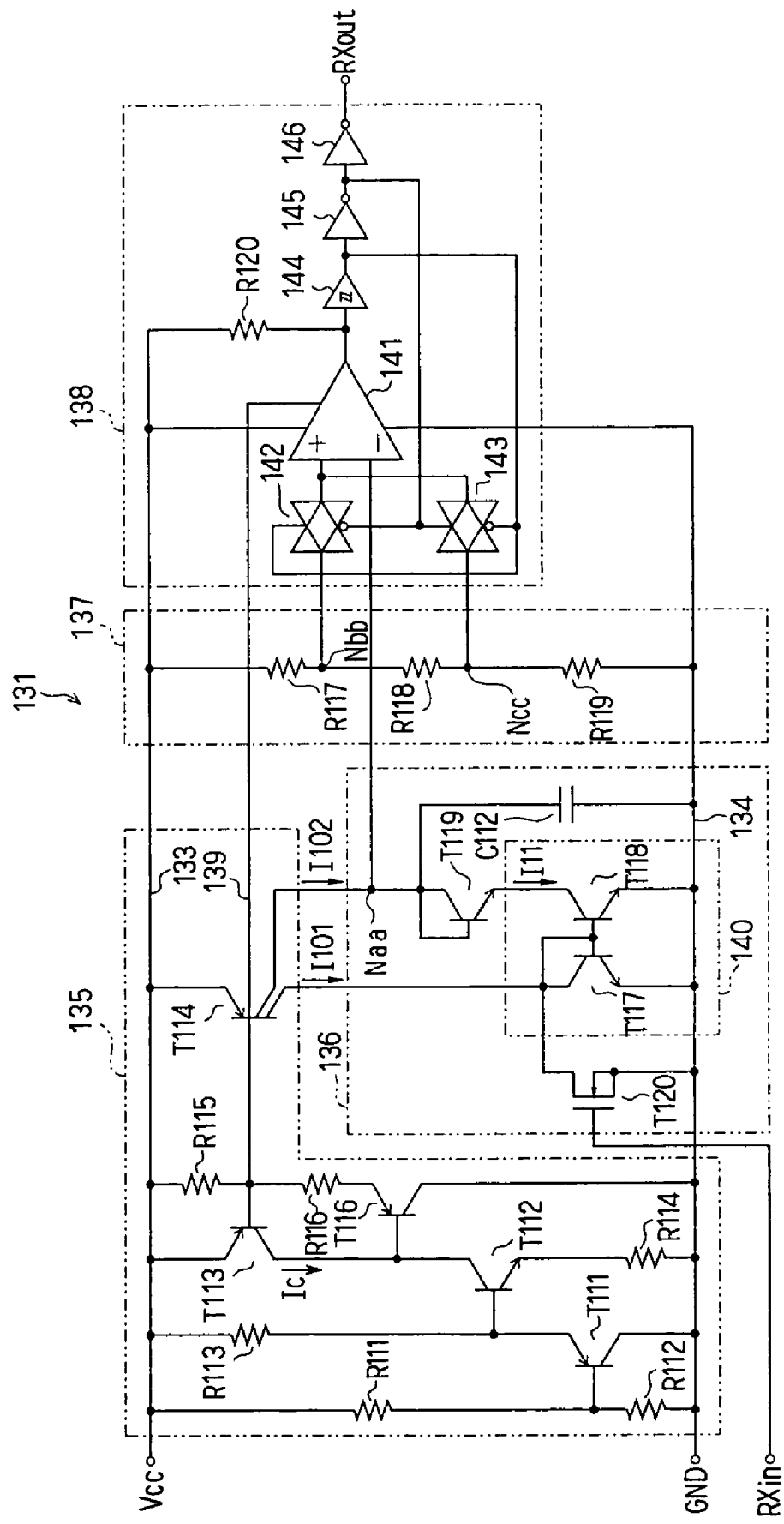
FIG. 11 is a schematic circuit diagram of the filter circuit based according to a preferred embodiment.

Referring to FIG. 11, the circuit arrangement of the filter circuit 131 will be discussed. The filter circuit 131 includes a constant current circuit 135, a charge-and-discharge circuit 136, a reference voltage generation circuit 137, and a comparison circuit 138. The filter circuit 131 receives a power supply voltage of 5 V through power lines 133 and 134 from the constant voltage circuit 120. The following explains each circuit section of the filter circuit 131.

The constant current circuit 135 functions as the previously mentioned first and second constant current circuits. It includes voltage-dividing resistors R111 and R112 connected in series between the power supply lines 133 and 134, with the node of the resistors being connected to the base of a pnp-type transistor T111 having its collector grounded. The transistor T111 has its emitter connected to the power supply line 133 through a resistor R113 and also connected to the base of an npn-type transistor T112.

The transistor T112 has its emitter connected to the power supply line 134 through a resistor R114 and its collector connected to the power supply line 133 through the collector-emitter path of another pnp-type transistor T113. The pnp-type transistors T113 and T114 constitute a current mirror circuit, and their common base line 139 is connected to the power supply line 133 through a resistor R115 and also connected to the power supply line 134 through a resistor R116 and a pnp-type transistor T116, which are connected together in series.

The transistor T114 is of the multi-collector type, having a first and second collectors. The collector current Ic of the transistor T113, the first collector current I101 of the transistor T114 (output current of the first constant current circuit), and the second collector current I102 of the transistor T114 (output current of the second constant current circuit) are set to have a ratio of 4:1:1. The resistors R111, R112, R114, etc. of the constant current circuit 135 are formed of a material having a small thermal factor such as CrSi so that the currents I101 and I102 have a very small thermal factor.

The charge-and-discharge circuit 136 responsively charges and discharges a capacitor C112 (i.e., filtering capacitor) according to an input reception signal RXin. The charge-and-discharge circuit 136 includes emitter-grounded npn-type transistors T117 and T118 (i.e., first and second transistors), which together constitute a current mirror circuit 140. The transistor T117 has its collector and base connected commonly to the first collector of the transistor T114. The transistor T118 has its collector connected to the second collector of the transistor T114 through the collector-emitter path of an npn-type transistor T119 (i.e., offset voltage generation circuit) having its base and collector connected to each other.

The transistors T117 and T118 have their collector currents set to have a ratio of 1:2, and eventually a current I101' flowing in the transistor T118 and the second collector current I102 flowing out of the transistor T114 have a ratio of 2:1 (i.e., N=2). The transistors T117, T118 and T119 have the same characteristics, and therefore have an equal base-emitter voltage in their conductive state.

The transistor T117 has a parallel connection with an n-channel MOS transistor T120, which is supplied via the gate electrode with the input reception signal RXin released by the comparator 130. The capacitor C112 is connected between the collector (node Na) of the transistor T119 and the power supply line 134.

The reference voltage generation circuit 137 produces a first reference voltage V TH (i.e., first threshold voltage) used by the comparison circuit 138 during the charging of the capacitor C112 and a second reference voltage VtL (i.e., second threshold voltage) used by the comparison circuit 138 during the discharging of the capacitor C112. Resistors R117, R118 and R119 are connected in series between the power supply lines 133 and 134. These resistors R117, R118 and R119 have their resistances set to have a ratio of 2:1:2. The first reference voltage V TH of 3 V is produced at the node Nbb of the resistors R117 and R118, and the second reference voltage V TL of 2 V is produced at the node N1c of the resistors R118 and R119.

The comparison circuit 138 compares the capacitor C112 voltage Vc with the reference voltage V TH during the charging of the capacitor C112 and compares the voltage Vc with the reference voltage VTL during the discharging of C112 and generates an output reception signal RXout. The comparison circuit 138 includes a comparator 141, which receives a power supply voltage of 5 V from the power supply lines 133 and 134 and is also supplied with a bias voltage from the common base line 139.

The comparator 141 has its inverting terminal connected at the node Naa to one terminal of the capacitor C112, and has its non-inverting terminal connected to the nodes Nbb and Ncc through analog switches 142 and 143, respectively. The comparator 141 has its output terminal pulled up to the power supply voltage through a resistor R120, and it generates the reception signal RXout through a buffer circuit with hysteresis 144 and inverters 145 and 146.

The buffer circuit 144 and inverter 145 have their output terminals connected to the control terminals of the analog switches 142 and 143. A high-level (5 V) output of the comparator 141 turns on the analog switch 142 and turns off the analog switch 143, and a low-level (0 V) output of the comparator 141 turns off the analog switch 142 and turns on the analog switch 143.

The reference voltage generation circuit 137 and the comparison circuit 138 implement the previously mentioned logical bi-leveling circuit.

Figure 12:
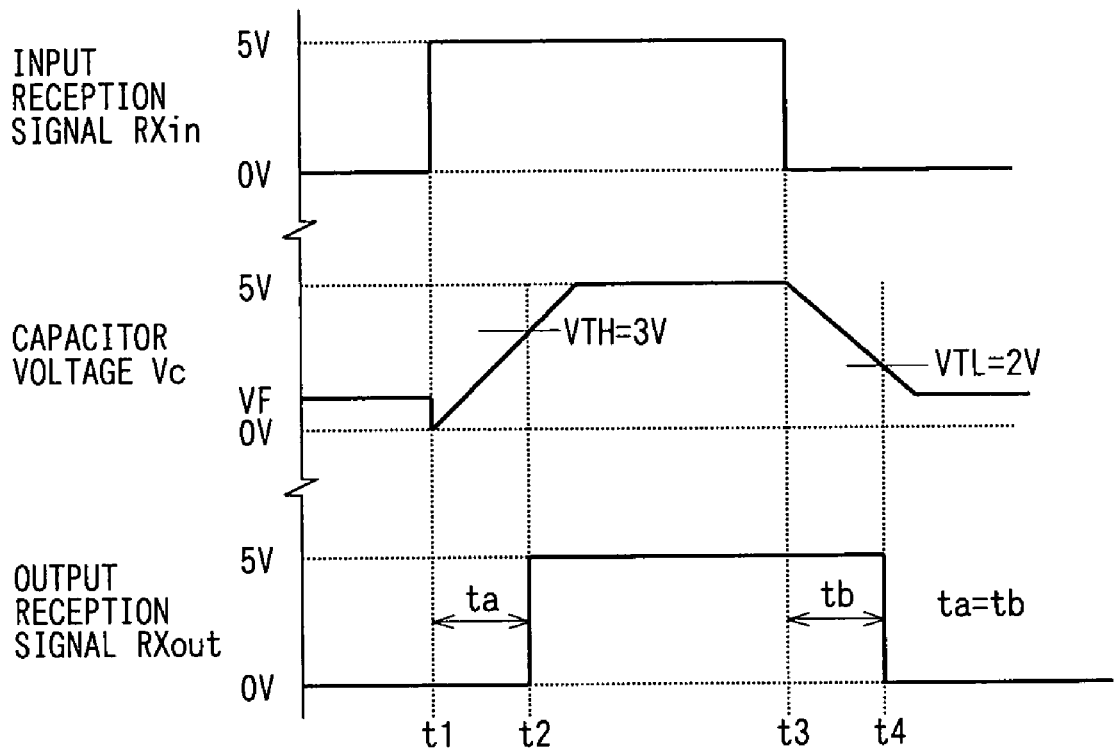
FIG. 12 is a waveform diagram of the filter circuit.
Figure 13:
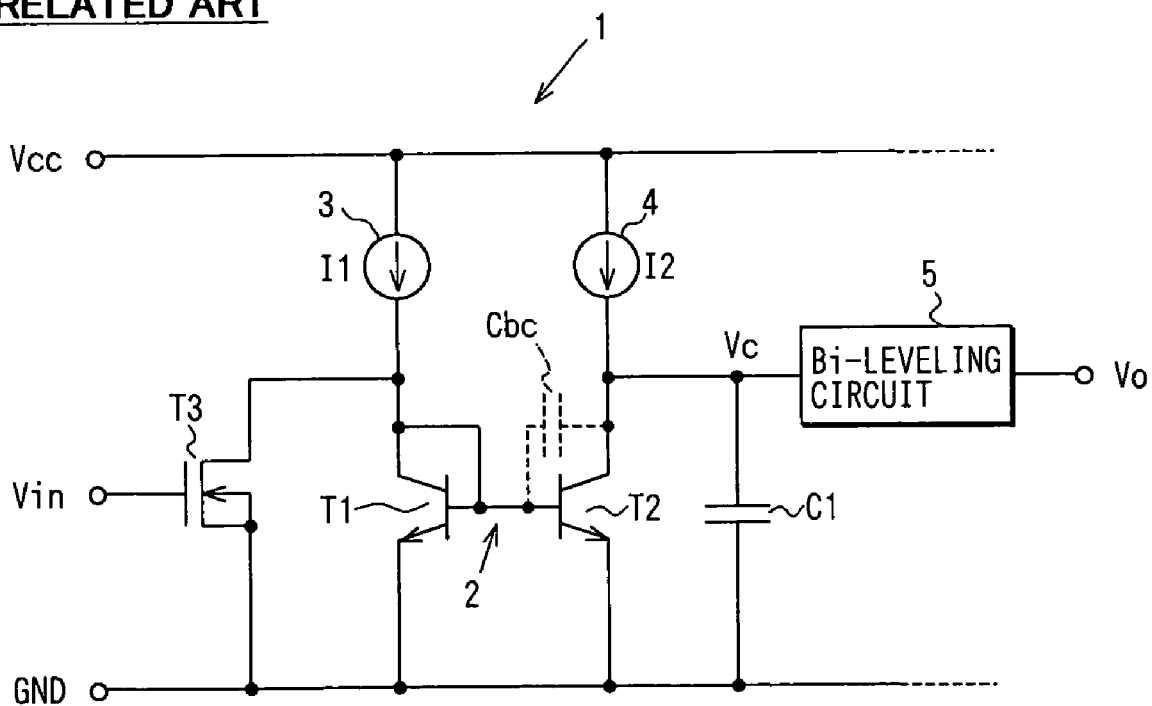
FIG. 13 is a brief schematic circuit diagram of a related art trapezoidal wave generation and filter circuit.
Figure 14:
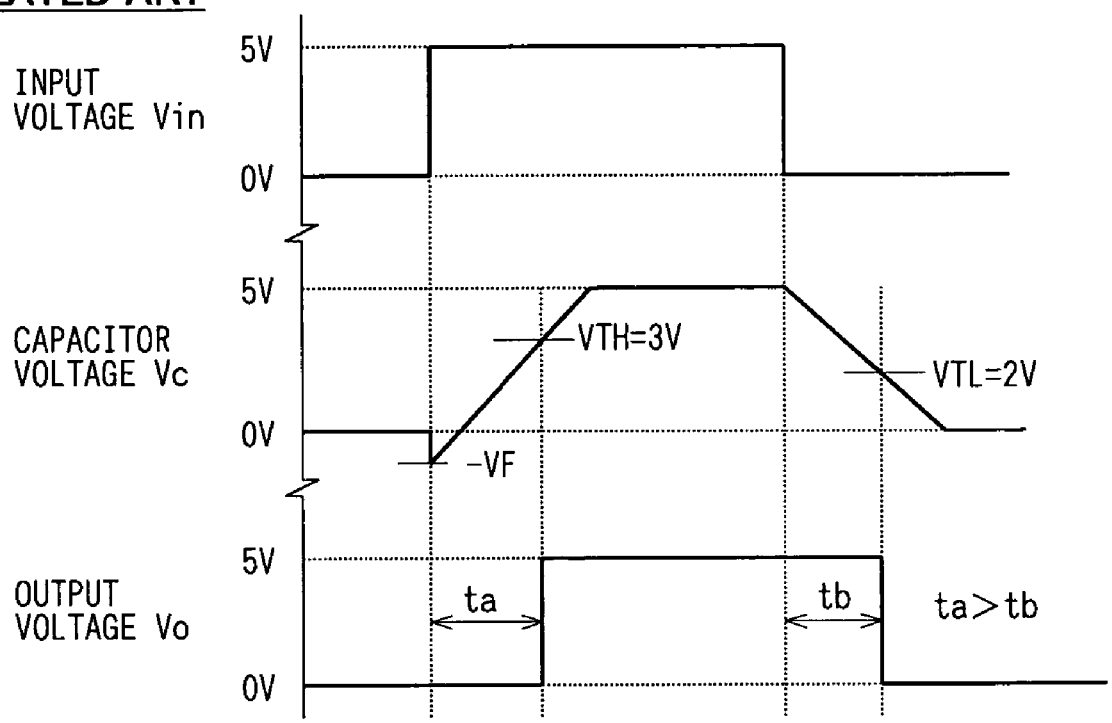
FIG. 14 is a waveform diagram of the related art trapezoidal wave generation and filter circuit.

Referring to FIG. 12, operation of the filter circuit will be discussed. When the transceiver IC 11 is in the sleep mode, the voltage supply from the constant voltage circuit 20 to the trapezoidal wave generation circuit 22, driver circuit 23 and receiver circuit 25 is shut off, and it cannot send or receive data. Operation of the transceiver IC 11 during normal operation mode will be discussed below.

In the LIN, the communication signal on the LIN bus is a trapezoidal wave signal having a prescribed thru-rate for reducing the creation of radio noise. The trapezoidal wave signal has a low reception threshold (dominant) at a 40% signal level and a high reception threshold (recessive) at a 60% signal level. The comparator 130 of the receiver circuit 25 has its threshold level set to the middle of these reception thresholds, thereby producing a square wave reception signal RXin having two logical levels.

The filter circuit 131 eliminates the noise included in the input reception signal RXin. FIG. 12 shows the operational signal waveforms, including: (a) the input reception signal RXin that is input to the filter circuit 131, (b) the capacitor C112 voltage Vc, and (c) the output reception signal RXout generated by the filter circuit 131. The following explains operation at the fall of the reception signal RXin and then operation at the rise of RXin next.

When the reception signal RXin turns from high to low level (at time t3), the transistor T120 turns off and the transistors T117 and T118 of the current mirror circuit 140 turn on. A current I102 flows from the transistor T114 to the node Naa, and a current I101' flows from the node Naa through the transistors T119 and T118. Consequently, the capacitor C112 is discharged by a constant current equal to I102 (or I101'/2), which causes the capacitor C112 voltage Vc to fall from 5 V at a constant rate.

At this state in which the capacitor C112 is discharging, the analog switches 142 and 143 are off and on, respectively, and the comparator 141 compares the voltage Vc with the reference voltage VtL (2 V). At time t4, on expiration of a time span tb in which the voltage Vc has fallen by 3 V since time t3, the reception signal RXout generated by the comparator 141 turns from a high to a low level. After this transition, the voltage Vc further falls, not to 0 V, but to the base-emitter voltage VF of the transistor T119 which is connected to function as a diode on the discharging path.

When the reception signal RXin turns from a low to a high level (at time t1), the transistor T120 turns on, causing the base voltage of the transistors T117 and T118 to fall instantaneously from VF to 0 V. Due to the coupling between the base and collector of the transistor T118 by the base-collector capacitance Cbc, the sharp fall of the base voltage is followed by the fall of the collector voltage of the transistor T118 and eventually by the fall of the capacitor C112 voltage Vc.

In this embodiment, the capacitor C112 has a small capacitance as a result of an extremely small layout area Therefore, a fall of the base voltage is virtually equal to a fall of the capacitor voltage Vc. However, the capacitor voltage Vc immediately before the signal RXin turns high is up-leveled by VF to thereby allow the above-mentioned voltage fall, and therefore the capacitor voltage Vc immediately after the signal RXin turns high becomes virtually 0 V. The transistors T117 and T118 turn off Consequently the capacitor C112 is charged by a constant current equal to I102 (or I101'/2), causing the capacitor C112 voltage Vc to rise from 0 V at a constant rate.

At this state in which the capacitor C112 is charging, the analog switches 142 and 143 are on and off, respectively, and the comparator 141 compares t he voltage Vc with the reference voltage V TH (3 V). At time t2, on expiration of a time span ta in which the voltage Vc has rise n by 3 V since time t1, the reception signal RXout generated by the comparator 141 turns from a low to a high level.

The absolute value of the charge current and the discharge current of the capacitor C112 is equal. Also, voltage variations of capacitor C112 causing transitions of reception signal RXout are equal. Therefore, the filtering time ta at the rise of signal and the filtering time tb at the fall of signal is also equal. Consequently, the input reception signal RXin and output reception signal RXout of the filter circuit 131 are consistent in each bit time slot of reception data, although RXout is shifted in time from RXin as the whole, whereby the filter circuit 131 can eliminate the noise while retaining the signal time-wise structure accurately.

As explained above, the receiver circuit 25 in the transceiver IC 11 of this embodiment loads the asynchronous serial communication data received over the LIN bus into the reception register 132 by way of the filter circuit 131, whereby the noise superimposed on the communication signal can be eliminated. Consequently, a stable and high quality vehicle on-board communication network free from communication error can be accomplished. Since the vehicle communication network adopts the LIN, which controls the thru-rate, the creation of radio noise can be reduced.

The filter circuit 131 in the normal operation mode is based on an approach in which the capacitor C112 is charged and discharged by a constant current in response to the reception signal RXin. Based on the provision of the offset voltage generation circuit, which compensates in advance the variation of the collect or voltage of transistor T118 caused by the base-collector capacitance Cbc, the filter circuit 131 can generate the reception signal Rxout to be noise-free by being virtually free from the level transitive time discordance of the reception signal RXin. As a result, the communication speed can be raised in comparison to the results achieved by conventional filter circuits. This compensation approach enables the capacitor C112 to have a smaller capacitance and eventually enables the transceiver IC 11 to have a smaller chip area.

The present invention is not confined to the embodiment described above and shown by diagram, but the following alteration and expansion are possible for example.

Although the transistors used in the filter circuit 131 and the trapezoidal wave voltage generation circuit 22 in the foregoing embodiment are primarily bipolar transistors, the circuits may also be configured by use of FETs.

The communication protocol is not confined to the LIN, but other protocol such as the CAN is relevant. The present invention can be applied to the asynchronous serial communication of other networks besides the vehicle on-board communication network. The filter circuit 131 can be used generally for input signals having two logical levels besides the use in the receiver of asynchronous serial communication.

For usages other than the asynchronous serial communication, the second constant current circuit (transistor T114) connected in series to the filtering capacitor C112 of the filter circuit 131 can be designed generally to produce a constant current I102 which is 1/N (N>1) of the constant current I101' flowing through the second transistor T118. Based on this design, it becomes possible to set intended different values for the time difference of rising between the input and output signals and the time difference of falling between the input and output signals, besides the case of equalizing both time differences.

For usages other than the asynchronous serial communication, threshold voltages of the trapezoidal wave voltage generation circuit 22 may not be symmetric across VB/2 and may be produced by basing the reference on other voltage besides the forward voltage VF. The transistors T15-T18 may be adapted to conduct output currents different from each other.

Therefore, the present disclosure concerns a transceiver IC 11 for functioning as, for example, an asynchronous serial communication transmitter. The transceiver IC 11 includes a trapezoidal wave signal generation circuit 22 for producing a trapezoidal wave signal responsive to a control signal (such as, for example, the transmission data TXD), wherein the trapezoidal wave signal generation circuit includes means for decreasing harmonic components in the trapezoidal wave signal and for suppressing noise superimposed on the trapezoidal wave signal. The transceiver IC 11 also includes a driver circuit 23 for delivering the trapezoidal wave signal to a communication line (such as, for example, the LIN BUS 16) and a receiver circuit 25 for receiving the trapezoidal wave signal over the communication line. The receiver circuit 25 includes a waveform shaping circuit (or comparator) 130 for shaping the trapezoidal signal waveform received over the communication line to thereby logically bi-level the signal into two logical levels, a filter circuit 131 for receiving the logically bi-leveled signal and for releasing a resultant 2-level signal. The filter circuit 131 has a filtering time at the rise of the logically bi-leveled signal substantially equal to a filtering time at the fall of the logically bi-leveled signal.

The means for decreasing harmonic components in the trapezoidal wave signal and for suppressing noise superimposed on the trapezoidal wave signal is preferably embodied by a first current output circuit such as transistor T12 for conducting a charge current to a capacitor C11 that generate the trapezoidal wave signal, a second current output circuit (such as transistors T13 and T14 in pairs for conducting a discharge current from the capacitor C11 responsive to the control signal, wherein the discharge current is approximately twice the value of the charge current. The means also preferably includes a first threshold voltage generation circuit 37 for producing a plurality of first threshold voltages by basing a reference on a first power supply line of a power supply voltage, a second threshold voltage generation circuit 38 for producing a plurality of second threshold voltages by basing a reference on a second power supply line of the power supply voltage, and a current control circuit 32 for controlling the first and second current output circuits based on a capacitor voltage with the first and second threshold voltages such that the voltage difference between the capacitor voltage and a voltage of the first or second power supply lines corresponds to the charge and discharge currents of the capacitor C11.

The filter circuit 131 preferably comprises a current mirror circuit comprised of first and second transistors (such as T117, T118) having their control electrodes connected to each other, with the voltage of the joined control electrodes varying in response to the variation in level of the input signal (such as Rxin), a first constant current 135 circuit connected to the first transistor (one of T117, T118), a filtering capacitor C112, a second constant current circuit (also 135) for producing a constant current that is 1/N (N>1) of a constant current flowing through the second transistor (one of T117, T118) connected in series to the filtering capacitor C112. The filter circuit 131 also includes an offset voltage generation circuit (npn-type transistor T19) connected between one terminal of the filtering capacitor C112 to which the constant current from the second constant current circuit 135 flows in and the second transistor, and adapted to produce a prescribed offset voltage. The filter circuit 131 also includes a logical bi-leveling circuit (a set of the reference voltage generation circuit 37 and comparison circuit 38) for producing an output signal having two logical levels based on the voltage between terminals of the filtering capacitor.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A serial communication transceiver comprising:
   a trapezoidal wave signal generation circuit for producing a trapezoidal wave signal responsive to a control signal, wherein the trapezoidal wave signal generation circuit includes means for decreasing harmonic components in the trapezoidal wave signal and for suppressing noise superimposed on the trapezoidal wave signal;
   a driver circuit for delivering the trapezoidal wave signal to a communication line; and
   a receiver circuit for receiving another trapezoidal wave signal over the communication line, wherein the receiver circuit includes:
   a waveform shaping circuit for shaping the another trapezoidal wave signal received over the communication line to thereby logically bi-level the signal into two logical levels; and
   a filter circuit for receiving the logically bi-leveled signal and for releasing a resultant 2-level signal, wherein the filter circuit has a filtering time at the rise of the logically bi-leveled signal suhstantially equal to a filtering time at the fall of the logically bi-leveled signal.

2. A serial communication transceiver according to claim 1, wherein the means for decreasing harmonic components in the trapezoidal wave signal and for suppressing noise superimposed on the trapezoidal wave signal comprises:
   a first current output circuit for conducting a charge current to a capacitor that generate the trapezoidal wave signal;
   a second current output circuit for conducting a discharge current from the capacitor responsive to the control signal, wherein the discharge current is approximately twice the value of the charge current;
   a first threshold voltage generation circuit for producing a plurality of first threshold voltages by basing a reference on a first power supply line of a power supply voltage;
   a second threshold voltage generation circuit for producing a plurality of second threshold voltages by basing a reference on a second power supply line of the power supply voltage; and
   a current control circuit for controlling the first and second current output circuits based on a capacitor voltage with the first and second threshold voltages such that the voltage difference between the capacitor voltage and a voltage of the first or second power supply lines corresponds to the charge and discharge currents of the capacitor.

3. A serial communication transceiver according to claim 1, wherein the filter circuit further comprises:
   a current mirror circuit comprised of a first and second transistors having their control electrodes connected to each other, with the voltage of the joined control electrodes varying in response to the variation in level of the input signal;
   a first constant current circuit connected to the first transistor;
   a filtering capacitor;
   a second constant current circuit for producing a constant current that is 1/N (N>1) of a constant current flowing through the second transistor connected in series to the filtering capacitor;
   an offset voltage generation circuit connected between one terminal of the filtering capacitor to which the constant current from the second constant current circuit flows in, and the second transistor, wherein the offset voltage generation circuit is adapted to produce a prescribed offset voltage; and a logical bi-leveling circuit for producing an output signal having two logical levels based on the voltage between terminals of the filtering capacitor.

4. A filter circuit for an input signal having two logical levels, the filter circuit comprising:

a current mirror circuit comprised of a first and second transistors having their control electrodes connected to each other, with the voltage of the joined control electrodes varying in response to the variation in level of the input signal;

a first constant current circuit connected to the first transistor;

a filtering capacitor;

a second constant current circuit which produces a constant current which is 1/N (N>1) of a constant current flowing through the second transistor which is connected in series to the filtering capacitor;

an offset voltage generation circuit which is connected between one terminal of the filtering capacitor on which the constant current from the second constant current circuit flows in and the second transistor, and adapted to produce a prescribed offset voltage; and a logical bi-leveling circuit for producing an output signal having two logical levels based on the voltage between the terminals of the filtering capacitor.

5. A filter circuit according to claim 4, wherein the offset voltage generation circuit produces an off set voltage which is equal to the voltage variation width on the joined control electrodes of the transistors which is derived from the voltage variation of the input signal.

6. A filter circuit according to claim 5, wherein the offset voltage generation circuit comprises a transistor of the same type as the first transistor, with the base and collector or the gate and drain of the offset voltage generating transistor being connected to each other.

7. A filter circuit according to claim 6, wherein the logical bi-leveling circuit comprises a comparison circuit for comparing the voltage of one terminal of the filtering capacitor with a threshold voltage by basing the reference voltage on another tenninal of the filtering capacitor, wherein the comparison circuit has a first threshold voltage used when the voltage across the filtering capacitor is rising and a second threshold voltage used when the capacitor voltage is falling, wherein the first threshold voltage being set equal to a differential voltage between a full-charge voltage of the filtering capacitor and the second threshold voltage.

8. A filter circuit according to claim 5, wherein the logical bi-leveling circuit comprises a comparison circuit for comparing the voltage of one terminal of the filtering capacitor with a threshold voltage by basing the reference voltage on another terminal of the filtering capacitor, wherein the comparison circuit has a first threshold voltage used when the voltage across the filtering capacitor is rising and a second threshold voltage used when the capacitor voltage is falling, wherein the first threshold voltage being set equal to a differential voltage between a full-charge voltage of the filtering capacitor and the second threshold voltage.

9. A filter circuit according to claim 4, wherein the logical bi-leveling circuit comprises a comparison circuit for comparing the voltage of one terminal of the filtering capacitor with a threshold voltage by basing the reference voltage on another terminal of the filtering capacitor, wherein the comparison circuit ha s a first threshold voltage used when the voltage across the filtering capacitor is rising and a second threshold voltage used when the capacitor voltage is falling, wherein the first threshold voltage being set equal to a differential voltage between a full-charge voltage of the filtering capacitor and the second threshold voltage.

10. A filter circuit according to claim 4, wherein the second constant current circuit produces a constant current that is a half of a constant current flowing through the second transistor.

11. A filter circuit according to claim 10, wherein the filter circuit is implemented within an asynchronous serial communication receiver comprising a waveform shaping circuit which reforms the signal waveform of asynchronous serial communication data, which is sent over a communication line, into a signal waveform having two logical levels, wherein the filter circuit is adapted to receive the data signal with a reformed waveform, and wherein a reception register holds the output data signal of the filter circuit.

12. A filter circuit according to claim 11, wherein the asynchronous serial communication receiver is used for a vehicle on-board communication network based on a Local Interconnect Network (LIN) scheme.

13. A trapezoidal wave signal generation circuit comprising:

a capacitor having one terminal connected to a first power supply line and another terminal adapted to generate a trapezoidal wave signal;

a first current output circuit connected between a second power supply line and the another terminal of the capacitor, wherein the first current output circuit is for conducting a charge current to the capacitor;

a second current output circuit for conducting a discharge current that is twice the charge current, wherein the second current output circuit conducts the discharge current from the capacitor when a waveform control signal is at a first level, and halts the current conduction when the waveform control signal is at a second level;

a first threshold voltage generation circuit for producing a plurality of threshold voltages by basing a reference on a voltage of the first power supply line;

a second threshold voltage generation circuit for producing a plurality of threshold voltages by basing another reference on a voltage of the second power supply line; and a current control circuit for controlling the first and second current output circuits based on a comparison of the voltage between the terminals of the capacitor with the threshold voltages such that a voltage difference between the capacitor terminal voltage and the voltage of the first or second power supply line corresponds to the charge and discharge currents of the capacitor.

14. A trapezoidal wave signal generation circuit according to claim 13, wherein the current control circuit increases or decreases the charge and discharge currents at an increment or decrement of a certain reference current each time the capacitor terminal voltage exceeds any of the threshold voltages.

15. A trapezoidal wave signal generation circuit according to claim 13, wherein the first and second threshold voltage generation circuits produce threshold voltages that are symmetric across a center voltage of the voltages of the first and second power supply lines.

16. A trapezoidal wave signal generation circuit according to any of claim 13, wherein the first and second threshold voltage generation circuits are each comprised of a plurality of diodes and a constant current circuit connected in series between the first and second power supply lines.

17. A trapezoidal wave signal generation circuit according to claim 16, wherein the first threshold voltage generation circuit produces three threshold voltages that are different in steps by the amount of the forward voltage VF of pn junction by basing the reference on the voltage of the first power supply line, and the second threshold voltage generation circuit produces three threshold voltages that are different in steps by the forward voltage VF by basing the another reference on the voltage of the second power supply line.

18. A trapezoidal wave signal generation circuit according to claim 16, wherein the waveform generation circuit is adapted to receive a 2-level transmission data signal to be used as the waveform control signal and wherein a driver circuit receives the trapezoidal wave signal and outputs the trapezoidal wave signal over a communication line.

19. A trapezoidal wave signal generation circuit according to claim 18, being implemented within an asynchronous serial communication transmitter.

20. A trapezoidal wave signal generation circuit according to claim 18, wherein the asynchronous serial communication transmitter is used for a vehicle on-board communication network based on the Local Interconnect Network (LIN).

* * * * *